United States Patent
Forderhase (10) Patent No.: US 11,183,418 B2
(45) Date of Patent: Nov. 23, 2021

(54) TWO AXIS GONIOMETER TO ACCOMPLISH FINE, PERMANENT, CALIBRATION OF LIFT PIN HOOP ORIENTATION

(71) Applicant: Applied Materials, Inc., Santa Clara, CA (US)

(72) Inventor: Paul Forderhase, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 500 days.

(21) Appl. No.: 15/991,986

(22) Filed: May 29, 2018

(65) Prior Publication Data

US 2018/0350654 A1 Dec. 6, 2018

Related U.S. Application Data

(60) Provisional application No. 62/513,811, filed on Jun. 1, 2017.

(51) Int. Cl.
*H01L 21/687* (2006.01)

(52) U.S. Cl.
CPC .. *H01L 21/68742* (2013.01); *H01L 21/68785* (2013.01); *H01L 21/68792* (2013.01)

(58) Field of Classification Search
CPC ......... H01L 21/68742; H01L 21/68792; H01L 21/6878; H01L 21/6719; H01L 21/67748; H01L 21/67754; H01L 21/68785; F16F 1/377; B60R 2019/1866; B60R 2021/0414; B23Q 7/005; A47B 97/001; F16M 13/022; F16M 13/025

USPC ............... 248/560, 163.1; 267/136
See application file for complete search history.

(56) References Cited

U.S. PATENT DOCUMENTS

| | | | | |
|---|---|---|---|---|
| 5,332,443 A | * | 7/1994 | Chew | C23C 16/4583 118/715 |
| 6,767,176 B2 | * | 7/2004 | Yudovsky | H01L 21/67748 414/652 |
| 7,871,470 B2 | | 1/2011 | Schieve et al. | |
| 2002/0106485 A1 | * | 8/2002 | Monson | F16F 1/373 428/131 |
| 2004/0177813 A1 | * | 9/2004 | Schieve | H01L 21/68785 118/728 |

(Continued)

FOREIGN PATENT DOCUMENTS

EP 1202330 A2 5/2002

*Primary Examiner* — Mahdi H Nejad
(74) *Attorney, Agent, or Firm* — Patterson + Sheridan, LLP (57) ABSTRACT

Embodiments herein disclose a de-coupled substrate lift mechanism installation bracket and method of adjusting a plane of a lift pin hoop of the substrate lift mechanism. In one embodiment an apparatus for making adjustments about two remote axes includes a first adjustment mechanism and a second adjustment mechanism. The first adjustment mechanism includes a common member, one or more first side members, a connector member, and a plurality of first joints pivotably coupling the common member, the one or more first side members, and the connector member. The second adjustment mechanism includes a first body having the common member, one or more second side members, a first frame member, and a plurality of second joints pivotably coupling the common member, the one or more second side members, and the first frame member.

19 Claims, 10 Drawing Sheets

(56) References Cited

U.S. PATENT DOCUMENTS

| | | | |
|---|---|---|---|
| 2006/0238953 A1* | 10/2006 | Hanawa | H01L 21/6831 361/234 |
| 2009/0314211 A1* | 12/2009 | Du Bois | H01L 21/68742 118/729 |
| 2011/0024399 A1* | 2/2011 | Kim | H01J 37/32009 219/121.41 |
| 2014/0041579 A1* | 2/2014 | Jeong | H01L 21/68742 118/500 |
| 2014/0374680 A1* | 12/2014 | Tsang | B66F 7/0608 254/7 C |
| 2015/0224615 A1* | 8/2015 | Ling | B23Q 1/64 29/559 |
| 2016/0010239 A1* | 1/2016 | Tong | C30B 25/12 392/416 |
| 2017/0301579 A1* | 10/2017 | Hosaka | H01L 21/68764 |
| 2017/0335561 A1* | 11/2017 | Wickramasekera | H01L 31/042 |
| 2018/0039219 A1* | 2/2018 | Smed | F16M 11/2085 |
| 2018/0177299 A1* | 6/2018 | Pei | F16M 13/02 |
| 2019/0035671 A1* | 1/2019 | Ha | H01L 21/68757 |

* cited by examiner

TWO AXIS GONIOMETER TO ACCOMPLISH FINE, PERMANENT, CALIBRATION OF LIFT PIN HOOP ORIENTATION

CROSS-REFERENCE TO RELATED APPLICATIONS

This application claims benefit of U.S. Provisional Patent Application Ser. No. 62/513,811, filed on Jun. 1, 2017, which is herein incorporated by reference in its entirety.

BACKGROUND

Field

Embodiments of the present disclosure generally relate to apparatus for, and methods of manufacturing and assembly of, a processing chamber used in semiconductor device manufacturing. In particular, embodiments of the present disclosure relate to a substrate lift mechanism for transferring the substrate to and from a substrate support disposed in the processing chamber.

Description of the Related Art

Semiconductor processing chambers, such as physical vapor deposition (PVD) chambers, chemical vapor deposition (CVD) chambers, and etch chambers commonly use a substrate support to support a single substrate therein during processing thereof in the chamber. In many chambers, the substrate rests with a backside surface of the substrate, which is opposite to a device side surface thereof, directly on the support surface of the substrate support during processing of the substrate in the chamber. Typically, lift pins, movably disposed through the substrate support, are used to enable the positioning of the substrate onto the substrate support for processing and the removal of the substrate therefrom after processing. The lift pins allow for substrate handling without undesirable physical contact of the lift pins or a robot end effector with the substrate side surface. During processing, the tops of the lift pins are flush with, or located slightly below, the substrate support surface of the substrate support. To remove a substrate from the substrate support, the lift pins are raised from a location below the substrate support, thereby lifting the substrate off of the surface of the substrate support, to a height above the support whereby a robot end effector can move between the substrate support and the substrate. The lift pins are then lowered, positioning the backside surface of the substrate onto the robot end effector, which then removes the substrate from the processing chamber. The process is reversed to position a substrate onto the substrate support.

In some processing chambers, the substrate support is disposed on a substrate support shaft that is movably disposed through a base of the chamber body of the processing chamber. The substrate support is raised and lowered to and from a processing position by use of a substrate support lift mechanism coupled to the substrate support shaft and the lift pins are raised and lowered with respect to the substrate support using a substrate lift system. The substrate lift system used to raise and lower the lift pins may include a compound substrate lift mechanism or a de-coupled substrate lift mechanism.

Compound substrate lift mechanisms employ a single drive motor, and physical hard stops disposed within the compound lift mechanism, to actuate movement of both the support shaft and thus the substrate support, as well as the lift pins. Typically, with a compound lift mechanism, the movement of the lift pins is confined to a predetermined range based on the physical location of the hard stops. Thus, compound lift mechanisms are not easily adaptable to new chamber configurations which use different relative motion between the lift pins and substrate support, and a compound lift mechanism is generally limited to the specific processing chamber and process kit for which is was designed.

De-coupled substrate lift mechanisms are actuated by a drive motor independent of, and separate from, the substrate support lift mechanism. A de-coupled substrate lift mechanism generally includes a lift pin hoop, disposed about the substrate support shaft, having a plane that is parallel with a surface of the substrate support. When the lift pin hoop is raised, the lift pins disposed on or above the lift pin hoop are extended above the surface of the substrate support, through openings disposed therein, thereby lifting a substrate positioned thereon. De-coupled substrate lift mechanisms provide for cross platform flexibility and standardization of service procedures and parts, thereby reducing inventory burdens. However, de-coupling of the substrate lift mechanism and substrate support lift mechanism increases installation and calibration time of the substrate lift mechanism during assembly of the processing chamber. This is because stacking tolerances of multiple processing chamber components can result in non-parallelism between the plane of the lift pin hoop and the surface of the substrate support. The non-parallelism causes the top surfaces of the different lift pins to raise from the substrate support surface of the substrate support at different times as the lift pin hoop and substrate support move toward each other. Thus, the top surfaces of the different lift pins to retract into the substrate support surface of the substrate support at different times as the lift pin hoop and/or the substrate support move away from each other.

Unfortunately, non-parallelism between the plane of the lift pin hoop and the surface of the substrate support can cause the substrate to become misaligned on the substrate support as it is received on the substrate support surface thereof, or be misaligned with respect to the robot end effector after being lifted off of the substrate support surface. Adjustment of the plane of the lift pin hoop during the manufacturing and assembly of the processing chamber typically involves the use of shims used to adjust the spacing between the different portions of the lift pin hoop and the base of the chamber, or the substrate receiving surface of the substrate support, during installation of the substrate lift mechanism into the chamber body. This method is difficult to perform and time consuming, and does not allow for fine and incremental calibration of the substrate receiving surface of the substrate support to the pin engaging surface of the lift pin hoop.

Accordingly, there is a need in the art for apparatus and methods to enable fine, permanent, adjustments of the plane of the pin engaging surface of the lift pin hoop plane during the installation of the substrate lift mechanism.

SUMMARY

Embodiments disclosed herein generally relate to a de-coupled substrate lift mechanism and an installation bracket and method for adjusting the plane of the pin engaging surface of a lift pin hoop of the substrate lift mechanism. Typically, the installation bracket comprises two orthogonal four-bar mechanisms that enable rotation of the lift pin hoop about two orthogonal axes disposed in a plane of the pin engaging surface of the lift pin hoop.

In one embodiment a mounting bracket comprises a first adjustment mechanism and a second adjustment mechanism. The first adjustment mechanism comprises a common member, one or more first side members, a connector member, and a plurality of first joints pivotably coupling the common member, the one or more first side members, and the connector member. The second adjustment mechanism comprises a first body having the common member, one or more second side members, a first frame member, and a plurality of second joints pivotably coupling the common member, the one or more second side members, and the first frame member.

In another embodiment, a processing chamber comprises a chamber body defining a processing volume and having a base, a substrate support shaft, a substrate support disposed on the substrate support shaft inside the processing volume, and a substrate lift mechanism. The substrate lift mechanism comprises an installation bracket fixedly coupled to an exterior wall of the base of the chamber body. The installation bracket comprises a first adjustment mechanism and a second adjustment mechanism. The first adjustment mechanism comprises a common member, one or more first side members, a connector member, and a plurality of first joints pivotably coupling the common member, the one or more first side members, and the connector member. The second adjustment mechanism comprises the common member, one or more second side members, a frame member and a plurality of second joints pivotably coupling the common member, the one or more second side members, and the frame member. The substrate lift mechanism further comprises a lift pin hoop disposed about the substrate support shaft and coupled to a first end of a lift shaft and an actuator assembly coupled to the installation bracket and to a second end of the lift shaft.

In another embodiment, a substrate lift system is provided. The substrate lift system comprises an installation bracket, a lift pin hoop coupled to a first end of a lift shaft, and an actuator assembly coupled to the installation bracket and to a second end of the lift shaft. The installation bracket comprises a first adjustment mechanism and a second adjustment mechanism. The first adjustment mechanism comprises a common member, one or more first side members, a connector member, and a plurality of first joints pivotably coupling the common member, the one or more first side members, and the connector member. The second adjustment mechanism comprises the common member, one or more second side members, a frame member, and a plurality of second joints pivotably coupling the common member, the one or more second side members, and the frame member.

In another embodiment, a method is provided for adjusting the orientation of the plane of the pin engaging surface of the lift pin hoop using the installation bracket. The method includes fixedly coupling the installation bracket to the exterior of a processing chamber, adjusting the plane of the pin engaging surface of the lift pin hoop about a first axis using a first adjustment mechanism of the installation bracket, adjusting the plane of the lift pin hoop about a second axis, where the second axis is orthogonal to the first axis, using a second adjustment mechanism of the installation bracket, and fixing the positions of the first adjustment mechanism and the second adjustment mechanism using a plurality of lock plates fixedly coupled to surfaces of the installation bracket with a plurality of fasteners.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a processing chamber and methods of assembling the processing chamber. More specifically, embodiments described herein relate to a substrate lift mechanism and the installation and adjustment thereof.

The de-coupled substrate lift mechanism described herein enables a robot, having an end effector for substrate handling, to transfer a substrate into and out of the processing chamber, and to position the substrate on a surface of a substrate support, without physically contacting the side of the substrate. A plurality of lift pins, disposed through openings in the substrate support, are raised or lowered by virtue of contact with a moveable lift pin hoop disposed below the substrate support. Generally, the plane of the upper surface of the lift pin hoop, i.e., the pin engaging surface thereof, should be parallel with the surface of the substrate support so that the lift pins are raised and lowered equally during substrate transfer. High temperatures, corrosive gases, plasma RF energy, and other chamber conditions encountered during substrate processing in the chamber make it undesirable to locate permanent adjustment mechanisms inside of the chamber body. Accordingly, the apparatus and methods described herein enable adjustment about two orthogonal axes of rotation in the plane of the pin engaging surface of the lift pin hoop using adjustment mechanisms located outside of the chamber body.

Figure 1A:
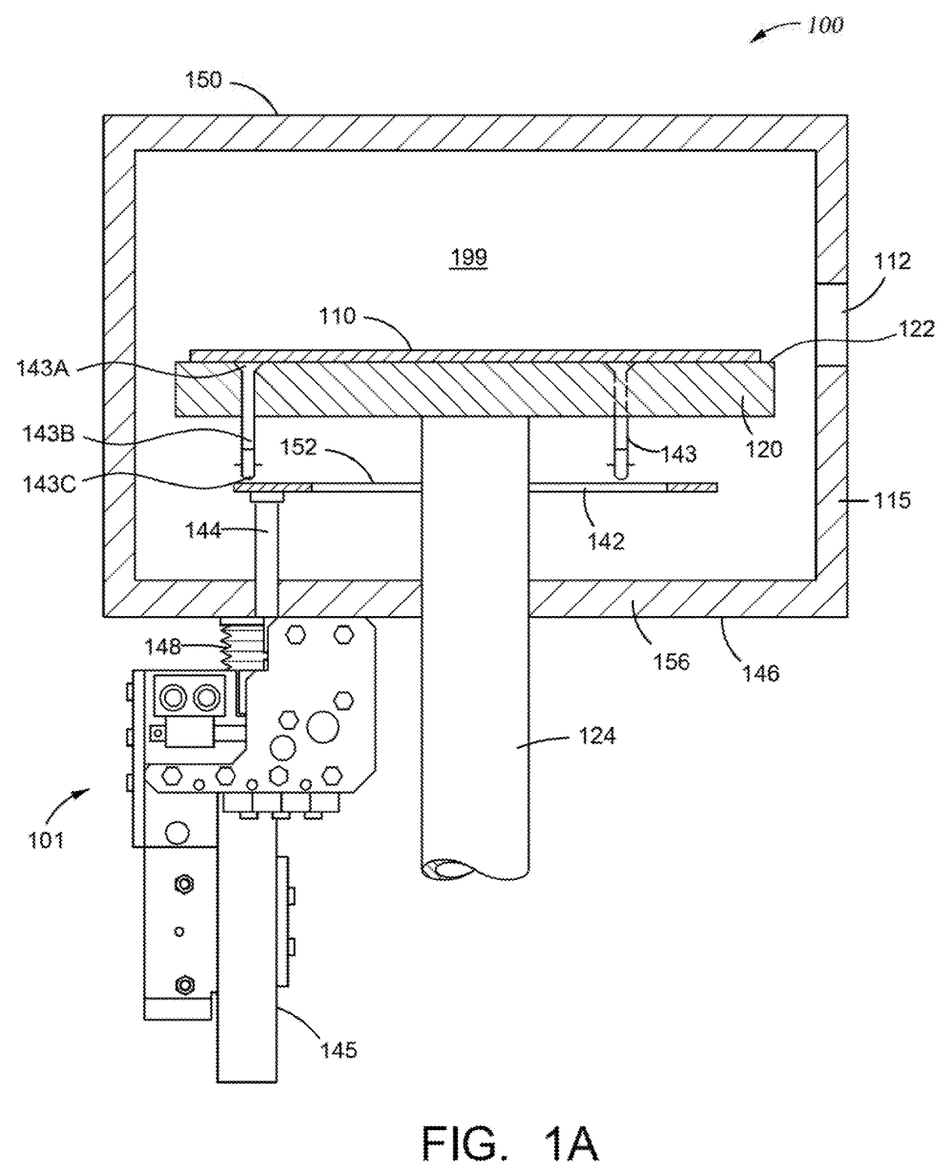
FIG. 1A is a cross sectional view of a processing chamber having a substrate lift mechanism coupled, through a base of the chamber body of the processing chamber, to a lift pin positioning system according to embodiments of the disclosure.
Figure 1B:
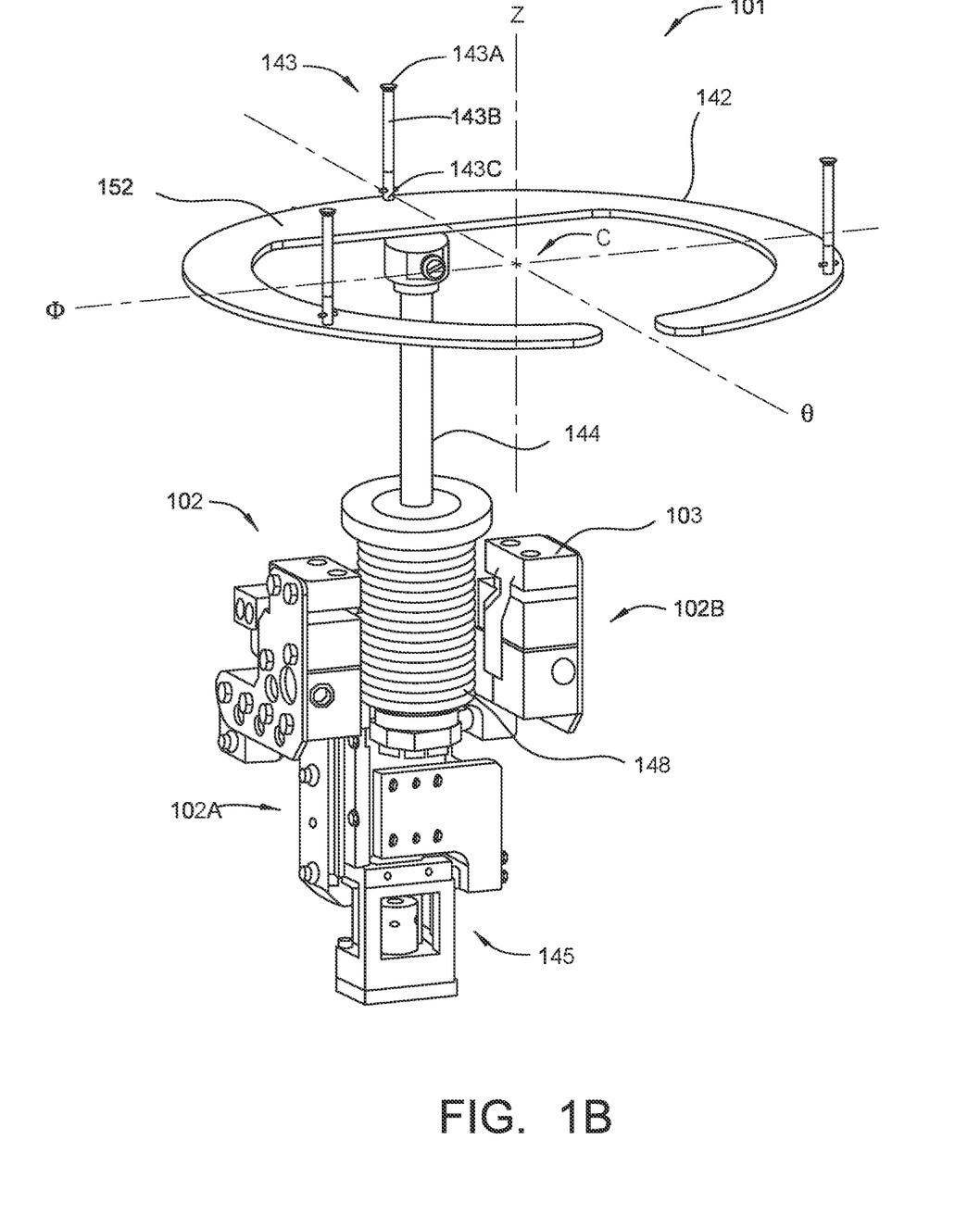
FIG. 1B is an isometric view of the substrate lift mechanism shown in FIG. 1A.

FIG. 1A is a cross sectional view of a processing chamber 100 having a substrate lift mechanism 101 coupled to the chamber body 150 thereof, according to one embodiment. FIG. 1B is an isometric view of the substrate lift mechanism 101 shown in FIG. 1A.

Typically, the processing chamber 100 includes the chamber body 150 defining a processing volume 199, a substrate support 120 disposed on a substrate support shaft 124 which extends through, and is movably disposed with respect to, the base 156 of the chamber body 150, and a substrate lift mechanism 101 coupled to the exterior wall 146 of the base 156 of the chamber body 150. The substrate lift mechanism 101 enables positioning of a substrate 110 onto the substrate support 120 for processing and removal of the substrate 110 therefrom after processing, as well as positioning the substrate 110 for receipt on, and removal from, a robot end effector (not shown). The robot end effector is coupled to a robot and is used to transfer the substrate 110 to and from the substrate support 120 through an opening 112 in the side wall 115 of the chamber body 150.

Herein, the substrate lift mechanism 101 includes a lift pin hoop 142 which extends substantially around the substrate support shaft 124 within the processing volume 199 and between the substrate support 120 and the base 156 of the chamber body 150. The lift pin hoop 142 is coupled to a first end of a lift shaft 144 which extends through, and is movable with respect to, the base 156 of the chamber body 150. A second end of the lift shaft 144 is coupled to an actuator assembly 145, such as a linear slide assembly, which raises and lowers the lift pin hoop 142. The actuator assembly 145 is coupled to an installation bracket 102 that is fixedly coupled to the exterior wall 146 of the base 156 of the chamber body 150 at one or more mounting surfaces 103 thereof using a plurality of fasteners (not shown), such as a plurality of bolts. A bellows 148, coupled to the exterior wall 146 and surrounding the lift shaft 144 exterior to the chamber body 150 maintains the vacuum condition of the processing volume 199 and prevents the passage of atmospheric gases into, and process gases from, the processing volume 199.

The substrate lift mechanism 101 further includes a plurality of lift pins 143 movably and vertically disposed through openings in the substrate support 120. When the lift pin hoop 142 is in a raised position (not shown) the pin engaging surface 152 thereof makes contact with the base ends 143C of the plurality of lift pins 143. Contact with the base ends 143C lifts the plurality of lift pins 143 to a position where the tops of the upper ends 143A of the plurality of lift pins 143 extend above the surface of the substrate support 120, to lift the substrate 110 off of the robot end effector (not shown). When the lift pin hoop 142 is subsequently lowered, the lift pins 143 likewise lower until tops of upper ends 143A of the lift pins 143, which are larger in diameter than the shafts 143B thereof, are flush or below the substrate receiving surface 122 of the substrate support 120 such that the substrate 110 is received thereon. Further lowering of the lift pin hoop 142 results in the pin engaging surface 152 of the lift pin hoop 142 no longer making contact with the base ends 143C of the plurality of lift pins 143. In some circumstances, the substrate support 120 may move with respect to the lift pin hoop 142 as the substrate 110 is placed onto, or removed from, the substrate receiving surface 122 thereof. Improper adjustment of the plane of the pin engaging surface 152 relative to the substrate receiving surface 122 results in different lift pins 143 of the plurality of lift pins 143 extending unequal distances from the substrate receiving surface 122 of the substrate support 120. As the lift pin hoop 142 moves the lift pins 143 with respect to the substrate receiving surface 122 misalignment of the substrate 110 with respect to the substrate receiving surface 122 can cause the substrate 110 to slide off the lift pins 143 or the robot end effector as the substrate 110 during substrate transfer.

Parallelism of the plane of the pin engaging surface 152 of the lift pin hoop 142 to a plane defined by the base ends 143C of the plurality of lift pins 143 120 is set during manufacturing and assembly of the processing chamber 100. Herein, adjustments to the plane of the pin engaging surface 152 of the lift pin hoop 142 are made using two mechanisms to adjust the location of two orthogonal lines extending in the plane of the pin engaging surface 152 of the lift pin hoop 142, a first adjustment mechanism 102A and a second adjustment mechanism 102B. Each of the adjustment mechanisms, 102A and 102B, include a four-bar mechanism that places a center of rotation at an axis remote from the installation bracket. The adjustment mechanisms, 102A and 102B, provide for rotation of the plane of the pin engaging surface 152 of the lift pin hoop 142 about a first axis, the theta axis $\theta$, and a second axis, the phi axis $\phi$ orthogonal to the theta axis $\theta$. Herein, both the theta axis $\theta$ and the phi axis $\phi$ are in the plane of the pin engaging surface 152 of the lift pin hoop 142 and intersect at the lift pin hoop center C.

Figure 2:
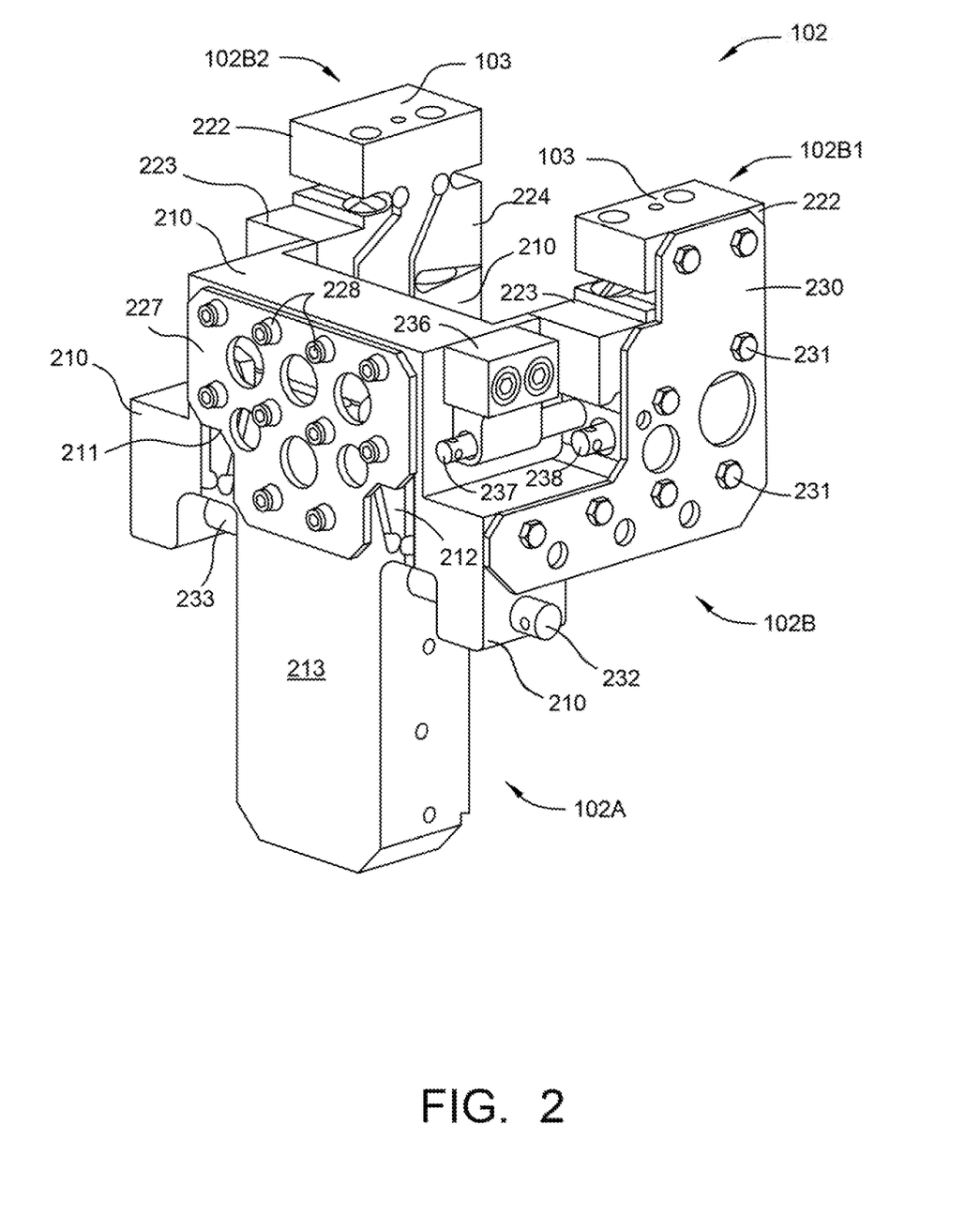
FIG. 2 is an isometric view of an installation bracket of the substrate lift mechanism shown in FIGS. 1A-1B, according to one embodiment.

FIG. 2 is an isometric view of the installation bracket 102, according to one embodiment. Herein, the installation bracket 102 includes the first adjustment mechanism 102A and the second adjustment mechanism 102B. The adjustment mechanisms 102A and 102B form a unitary body, such as a stainless steel body or an aluminum body, for example the unitary body may be fabricated by welding together individual stainless steel sub-bodies or may be machined from a monolithic block of stainless steel or aluminum. In other embodiments, the adjustment mechanisms 102A and 102B are separate bodies fixedly coupled to each other by a plurality of fasteners.

The adjustment mechanisms 102A and 102B each include one or more four-bar linkage systems. The links, hereafter "members", are coupled in a closed chain using a plurality of revolute joints. In one example, one of the members of each four-bar linkage system is fixed within the plane of the four-bar linkage system to create a planer four-bar mechanism. Generally a fixed member of a four-bar mechanism is also known as a frame member, a moving member opposite the frame member is also known as a connector member, and the members linking the frame member and the connector member are known as side members. Herein, a frame member of the first adjustment mechanism 102A and a connector member of the second adjustment mechanism 102B form a unitary body and will be collectively referred to as the common member 210. In one embodiment, the common member 210 is fabricated by welding together individual stainless steel sub-bodies. In another embodiment, the common member 210 is machined from a monolithic block of stainless steel or aluminum. In other embodiments, the common member 210 of the first and second adjustment mechanisms 102A-B is formed of a plurality of separate bodies fixedly coupled to each other by a plurality of fasteners.

The first adjustment mechanism is used to rotate the lift pin hoop 142 about the theta axis θ shown in FIG. 1B. The first adjustment mechanism 102A includes a first side member 212, a second side member 211, a connector member 213, and the common member 210 which form a four-bar mechanism for adjustment of the lift pin hoop 142. A first adjustment screw 232 and a second adjustment screw 233 are used to push the connector member 213 of the first adjustment mechanism 102A in a first direction away from the first adjustment screw 232 and towards the second adjustment screw 233, or in a second direction away from the second adjustment screw 233 and towards the first adjustment screw 232 which rotates the pin engaging surface 152 of the lift pin hoop 142 about the theta axis θ. A first lock plate 227 is coupled to surfaces of at least two members of the first adjustment mechanism, such as the connector member 213 and the common member 210, by a first plurality of fasteners 228. The first lock plate 227 is used to fix the position of the first adjustment mechanism 102A after adjustments to the angular position of the pin engaging surface 152 of the lift pin hoop 142 are made during assembly of the processing chamber 100. The first lock plate 227 is orthogonal to the axis of adjustment of the first adjustment mechanism 102A, i.e., the theta axis θ. The first lock plate 227 is orthogonal to the axis of adjustment of the first adjustment mechanism 102A, i.e., the theta axis θ. The first plurality of fasteners 228 are parallel with the axis of adjustment of the first adjustment mechanism 102A. The first plurality of fasteners 228 clamp the first lock plate 227 to the surfaces of the at least two members of the first adjustment mechanism 102A without exerting a rotational force thereon. Such clamping allows for the tightening of the first plurality of fasteners 228 and fixing of the members of the first adjustment mechanism 102A without causing undesirable rotation of pin engaging surface 152 of the lift pin hoop 142 about the theta axis θ.

The second adjustment mechanism 102B is used to rotate the pin engaging surface 152 of the lift pin hoop 142 about the phi axis φ shown in FIG. 1B. Herein, the second adjustment mechanism 102B includes a first body 102B1 and a second body 102B2 disposed on opposing sides of first adjustment mechanism 102A. The first body 102B1 and the second body 102B2 include mirrored components and each include a frame member 222 having a mounting surface 103 for securing the installation bracket 102 to the outer surface of the base of a chamber body, such as the exterior wall 146 of the base 156 of the chamber body 150 in FIG. 1A. The first body 102B1 and the second body 102B2 each further include an inside member 223, an outside member 224, and the common member 210. One or more second lock plates 230 are used to fix the position of the second adjustment mechanism 102B and are secured to the first body 102B1 and the second body 102B2 using a second plurality of fasteners 231. The second plurality of fasteners 231 clamp the one or more second lock plates 230 to the surfaces of at least two members of the first body 102B1 and/or to the surfaces of at least two members the second body 102B2 of the second adjustment mechanism 102B without exerting rotational forces thereon. Such clamping allows for the tightening of the second plurality of fasteners 231 and fixing of the members of the first body 102B1 and/or the second body 102B2 without causing undesirable rotation of the pin engaging surface 152 of the lift pin hoop 142 about the phi axis φ.

Figure 3:
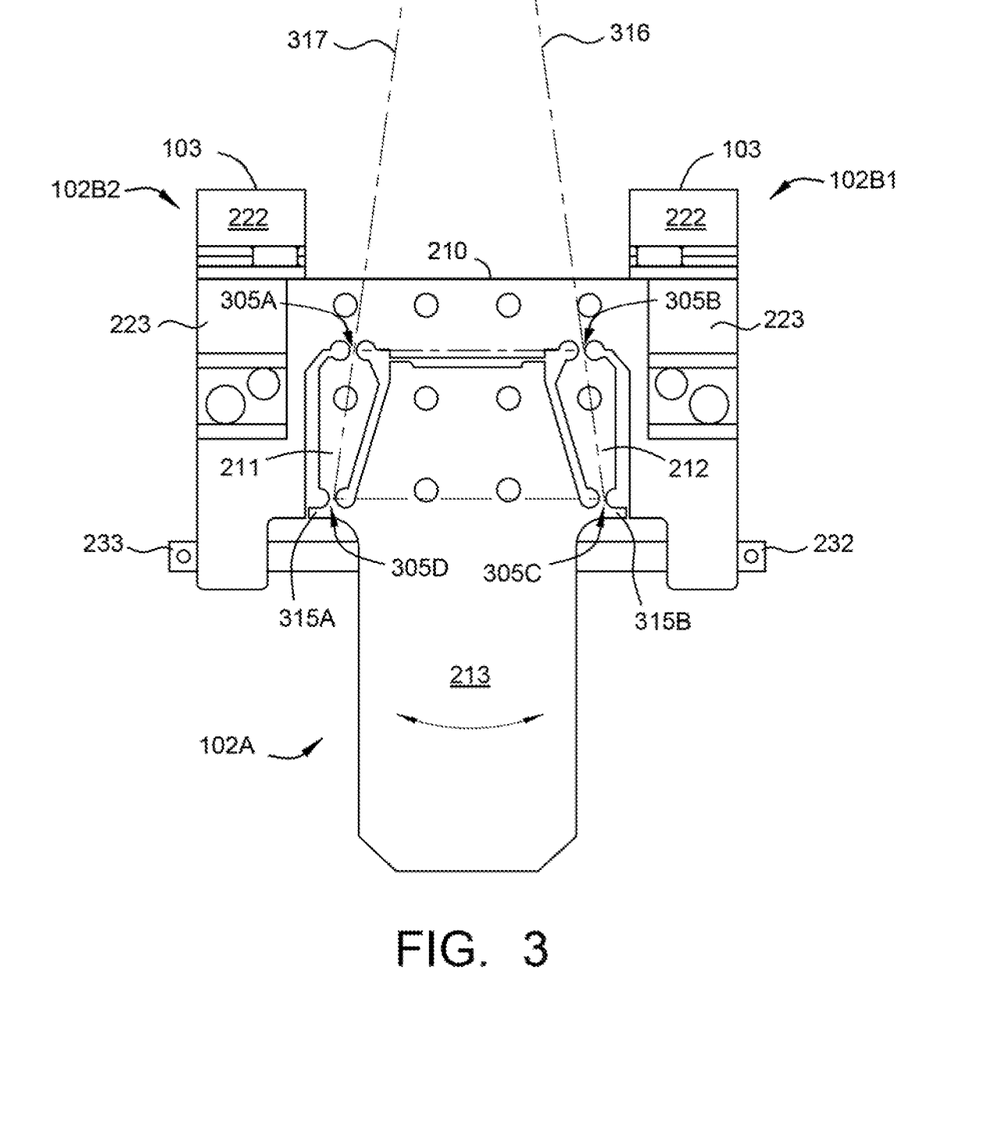
FIG. 3 is a front view of features of the installation bracket shown in FIG. 2.

FIG. 3 is a plan view of the first adjustment mechanism 102A with the first lock plate 227 and the first plurality of fasteners 228 removed, according to one embodiment. As shown, the common member 210, the second side member 211, the first side member 212, and the connector member 213 are operatively coupled by a plurality of revolute joints, herein a plurality of first flexures 305A-D, to form a four-bar mechanism. Each of the first flexures 305A-D include a thin web of material disposed between two openings, such as between through holes and/or grooves, in the first adjustment mechanism 102A. The thin web of material of each of the first flexures 305A-D is configured to bend to act as a pivot point between, and linking, two adjacent members of the first adjustment mechanism 102A. The use of flexures to pivotably couple, and/or pivotably link, adjacent members of the adjustment mechanisms eliminates undesirable mechanical runout typically seen with other types of revolute joints which preserves a high resolution of the adjustment mechanisms. Herein, the plurality of first flexures 305A-D includes a first upper flexure 305B disposed between, and linking, the common member 210 and the first side member 212, and a first lower flexure 305C disposed between, and linking, the first side member 212 and the connector member 213. The plurality of first flexures 305A-D includes a second lower flexure 305D disposed between, and linking, the connector member 213 and the second side member 211, and an second upper flexure 305A disposed between, and linking, the second side member 211 and the common member 210. Each of the first flexures 305A-D are located so that a first plane 316, defined by the first lower flexure 305C and the first upper flexure 305B, and a second plane 317, defined by the second lower flexure 305D and the second upper flexure 305A, intersect at a desirable remote axis, herein the theta axis θ. The theta axis θ is in the plane of the pin engaging surface of the lift pin hoop 142. Adjusting the position of the connector member 213 relative to the position of the common member 210 enables rotation of the lift pin hoop 142 about the theta axis θ.

The position of the connector member 213 is adjusted using two opposing fine pitch adjustment screws disposed through threaded openings of the common member 210. A first adjustment screw 232 is used to push the connector member 213 in a clockwise direction and a second adjustment screw 233 is used to push the connector member 213 in a counter clockwise direction. Herein, the threaded openings are threaded bore holes, however, in other embodiments the threaded openings may be threaded sleeves coaxially disposed in openings through the common member 210. One or more physical hard stops 315, disposed on opposing sides of the connector member 213, confine the movement of the connector member 213 relative to the common member 210. This confinement prevents damage such as the elongation of, the fracturing of, or the breaking of the thin web of material forming the plurality of first flexures 305A-D caused by over rotation of the members linked by each of the first flexures 305A-D with respect to on another.

Figure 4A:
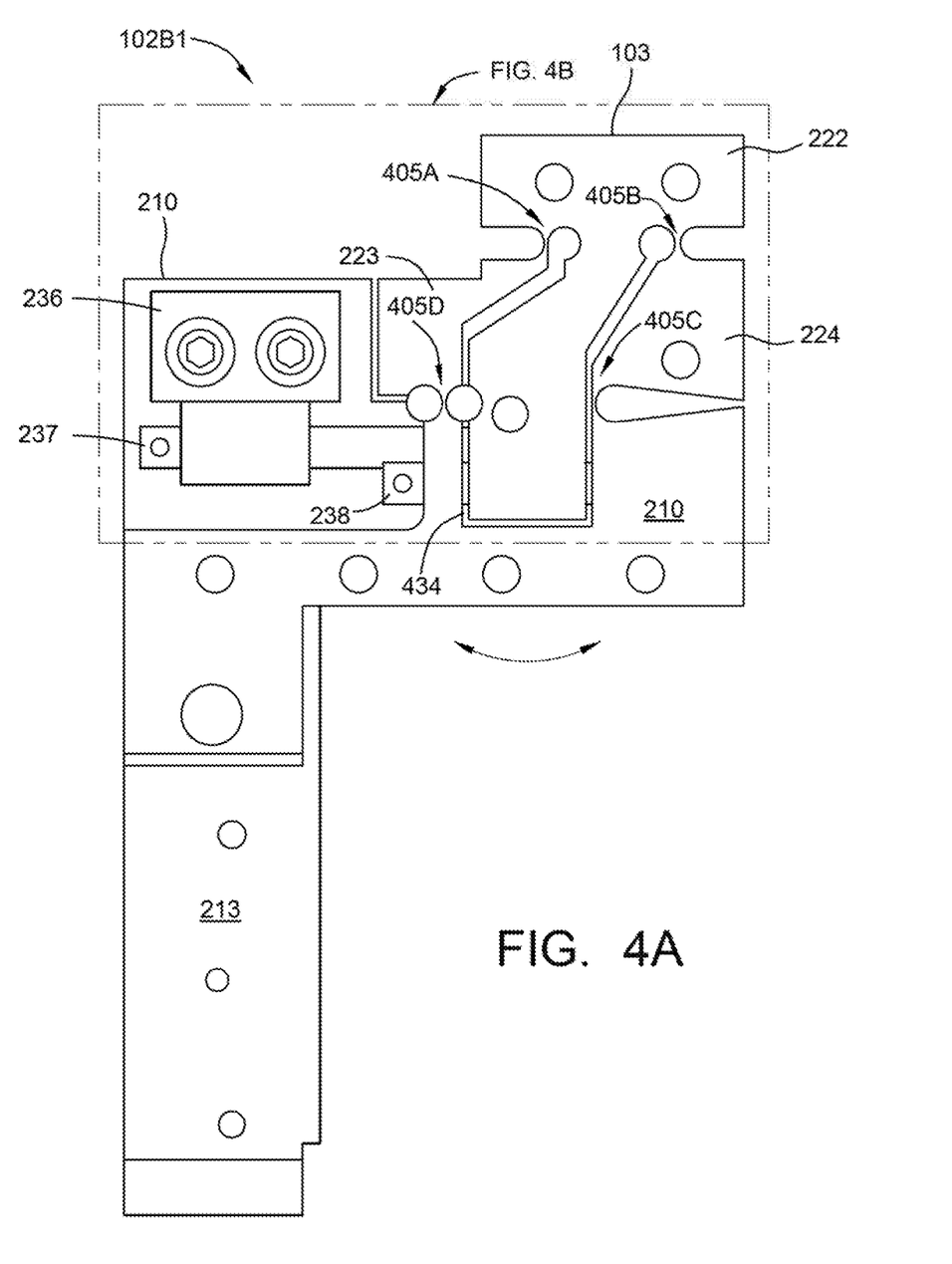
FIG. 4A is a side view of features of the installation bracket shown in FIG. 2.
Figure 4B:
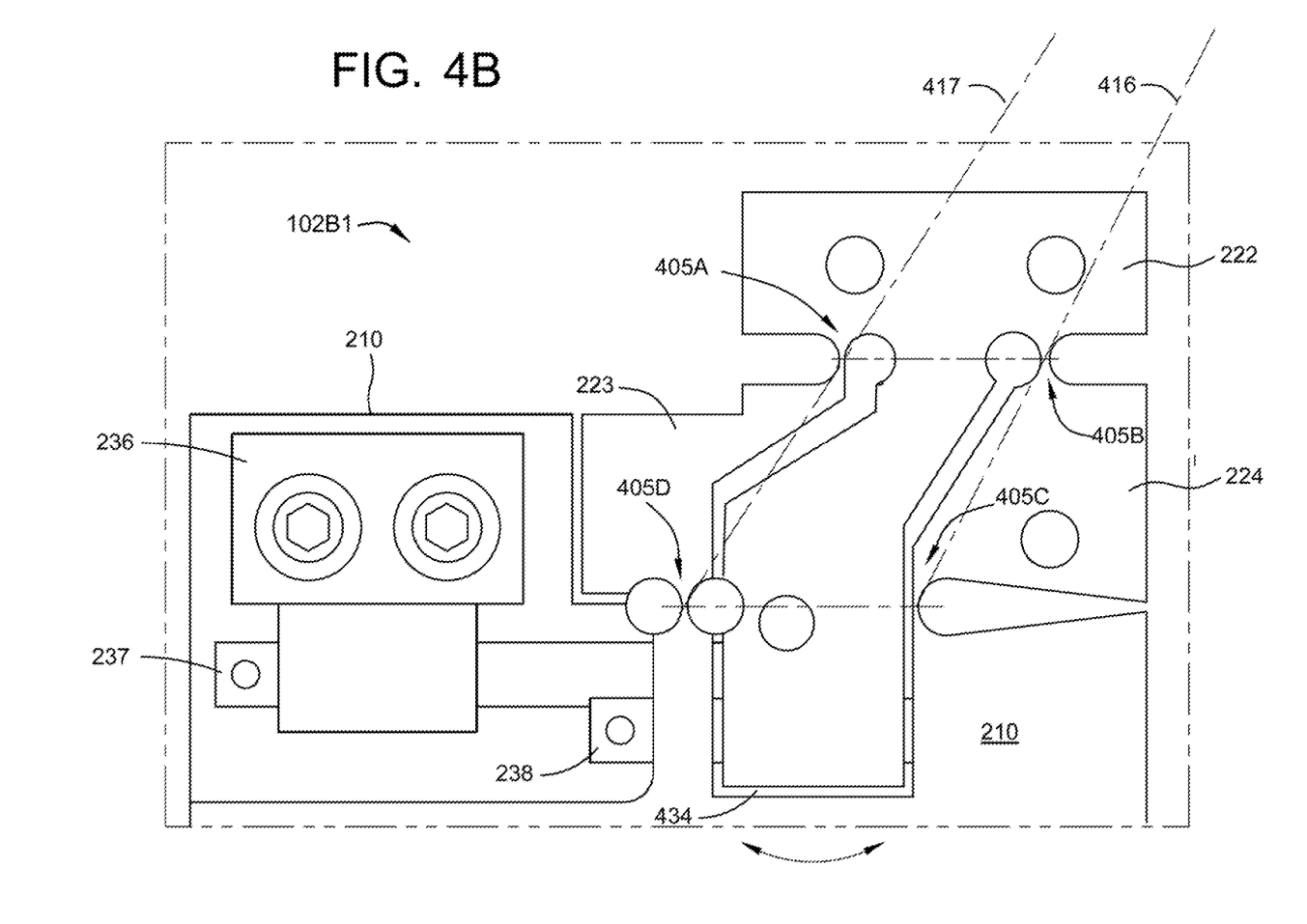
FIG. 4B is a close up side view of a portion of the installation bracket shown in FIG. 4A.

FIG. 4A is a plan view of the first body 102B1 of the second adjustment mechanism 102B with the second lock plate 230 and the second plurality of fasteners 231 removed. FIG. 4B is an enlarged view of a portion of the first body 102B1. As shown, the frame member 222, the outside member 224, the inside member 223, and the common member 210 are operatively coupled by a plurality of revolute joints, herein a plurality of second flexures 405A-D. Herein, the plurality of second flexures 405A-D of the first body 102B1 are formed in the same manner as the plurality of first flexures 305A-D described above for the first adjustment mechanism 102A. Each of the second flexures 405A-D bends to act as a pivot point disposed between, and linking, two adjacent members of the first body 10261. The plurality of second flexures 405A-D include an upper outside flexure 405B disposed between, and linking, the frame member 222 and the outside member 224, and a lower outside flexure 405C disposed between, and linking, the outside member 224 and the common member 210. The plurality of second flexures 405A-D also includes a lower inside flexure 405D disposed between, and linking, the common member 210 and the inside member 223, and a upper inside flexure 405A disposed between, and linking, the inside member 223 and frame member 222. Each of the plurality of second flexures 405A-D are located so that a third plane 416, defined by the upper outside flexure 405B and the lower outside flexure 405C, and a fourth plane 417, defined by the upper inside flexure 205A and the lower inside flexure 405D, intersect at a desirable remote axis. In one example, the desirable remote axis is the phi axis ϕ, and adjusting the second adjustment mechanism 102B enables rotation of the pin engaging surface 152 of the lift pin hoop 142 about the phi axis ϕ. Rotation of the pin engaging surface is enabled by adjusting the position of the common member 210 relative to the position of the frame member 222. The position of the common member 210 is adjusted using the forward adjustment screw 237 and the rear adjustment screw 238. Movement of the common member 210 is confined to a gap disposed between the frame member 222 and the common member 510. Confinement within the gap prevents damage such as the elongation of, the fracturing of, or the breaking of the thin web of material forming the plurality of second flexures 405 caused by over rotation of the members linked by each of the plurality of second flexures 405 with respect to one another.

Figure 4C:
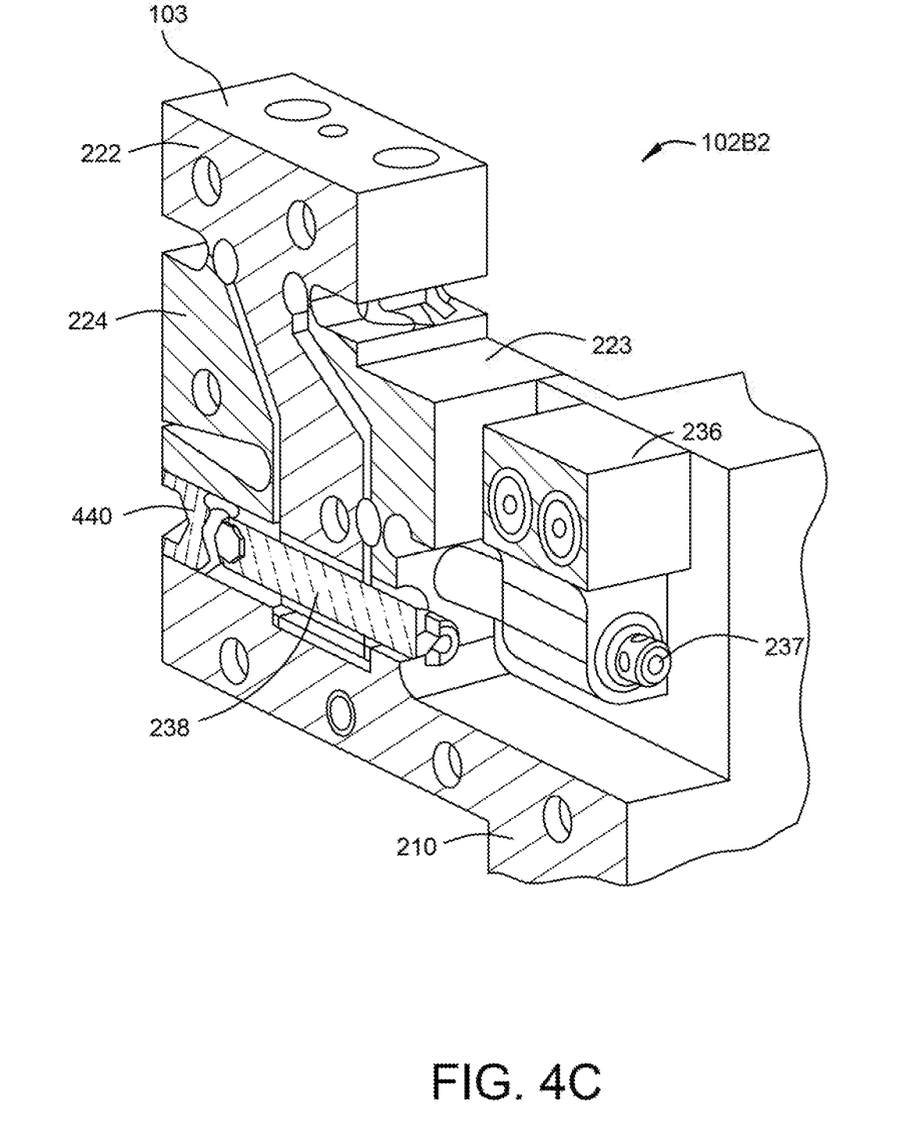
FIG. 4C is a schematic cross sectional view of a portion of the installation bracket shown in FIG. 2.

FIG. 4C is a schematic cross sectional view of a portion of the second body 102B2 according to embodiments disclosed herein. Adjustment of the plane of the pin engaging surface 152 of the lift pin hoop 142 about the phi axis ϕ is done using the forward adjustment screw 237 and the rear adjustment screws 238. The forward adjustment screw 237 is threaded through a forward threaded opening in a threaded bracket 236 which is coupled to the common member 210 by one or more fasteners. When tightened, the forward adjustment screw 237 pushes against the frame member 222 which causes the common member 210, and thus the lift pin hoop 142, to rotate in a counter clockwise direction. The rear adjustment screw 238 is threaded through a rear threaded opening in the frame member 222 and pushes against a setscrew 440 disposed in the common member 210. Herein, the forward threaded opening is a bore hole and the rear threaded opening is a threaded sleeve coaxially disposed in an opening through the frame member 222. When tightened, the rear adjustment screw pushes against the common member 210 causing the common member 210, and thus the lift pin hoop 142, to rotate in a clockwise direction.

Figure 5:
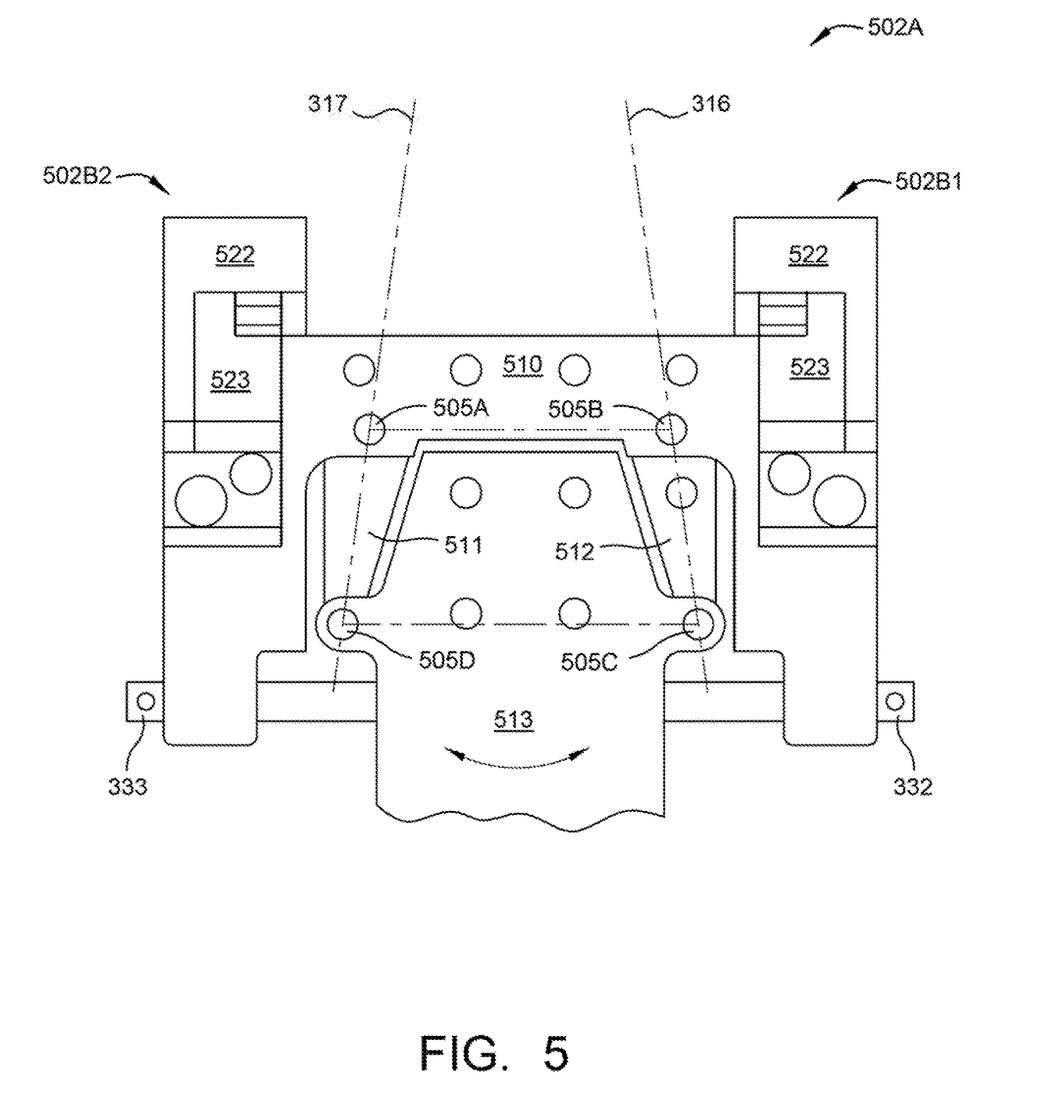
FIG. 5 is a front view of features of an installation bracket, according to another embodiment.
Figure 6:
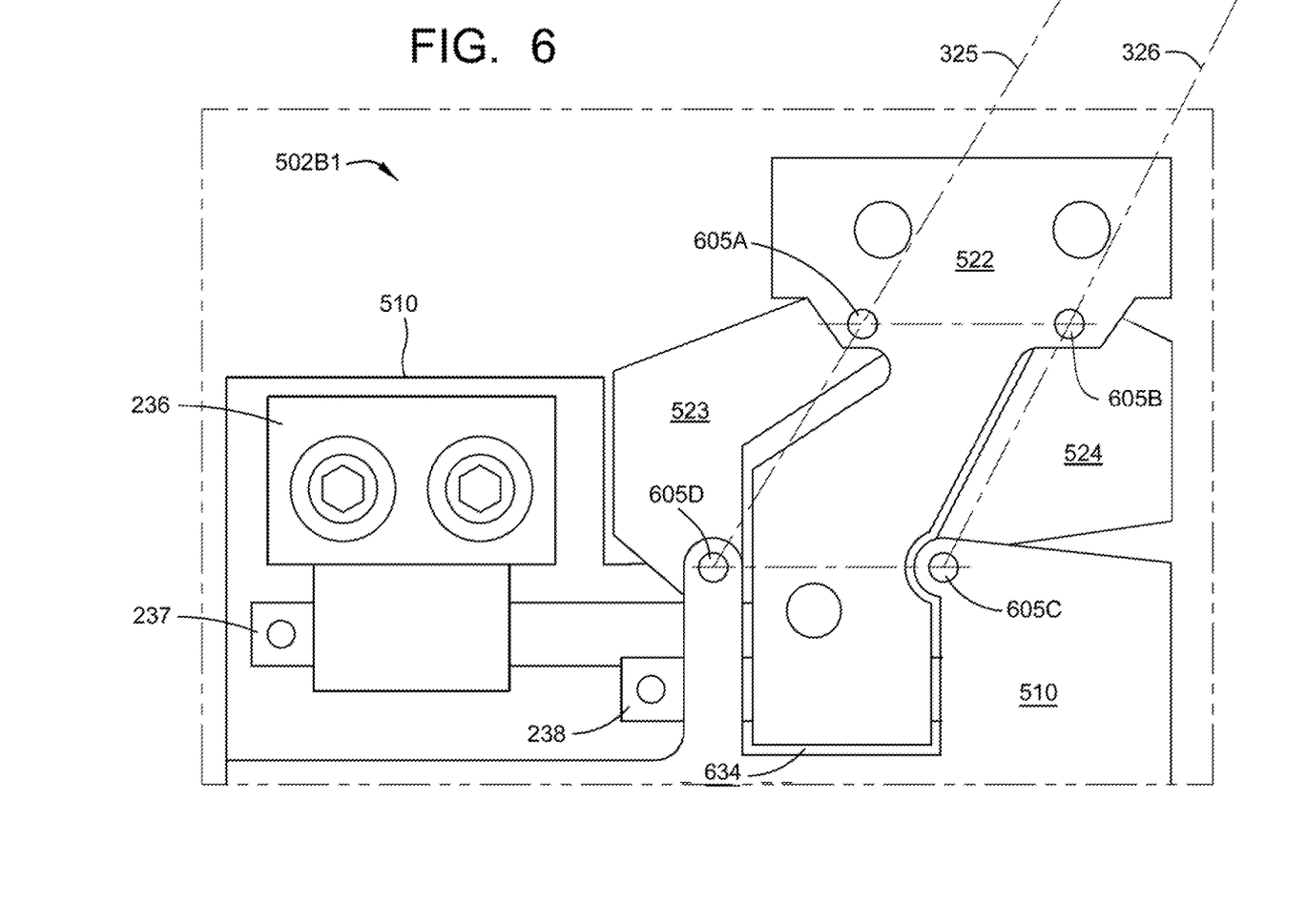
FIG. 6 is a side view of features of the installation bracket shown in FIG. 5.

FIG. 5 is a front view of features of an installation bracket, according to another embodiment. FIG. 6 is a side view of features of the installation bracket shown in FIG. 5. The installation bracket 502 of FIGS. 5 and 6 may be used with the processing chamber 100 and the substrate lift mechanism 101 described in FIGS. 1A and 1B. A threaded bracket 236, a forward adjustment screw 237 and a rear adjustment screw 238 shown in FIG. 6 are not shown in FIG. 5. FIGS. 5 and 6 are shown with corresponding lock plates and fasteners removed. Herein, the first adjustment mechanism 502A includes a common member 510, a first side member 512, a connector member 513, and a second side member 511. The common member 510, the first side member 512, the connector member 513, and the second side member are operatively coupled by a plurality of revolute joints, such as pin joints or bearing joints. Herein, the revolute joints feature a plurality of first pins disposed through openings in each of the members of the first adjustment mechanism 502A to form a plurality of first pin joints 505A-D. Each of the plurality of first pin joints 505A-D rotates to act as a pivot point disposed between, and coupling, two members of the first adjustment mechanism 502A, to form a planer four-bar mechanism. The plurality of first pin joints 505A-D includes a first upper pin joint 505B, a first lower pin joint 505C, a second lower pin joint 505D, and a second upper pin joint 505A. The first upper pin joint 505B is disposed between, and couples, the common member 510 and the first side member 512. The first lower pin joint 505C is disposed between, and couples, the first side member 512 and the connector member 513. The second lower pin joint 505D is disposed between, and couples, the connector member 513 and the second side member 511. The second upper pin joint 505A is disposed between, and couples, the second side member 511 and the common member 510. Each of the plurality of first pin joints 505A-D are located so that a first plane 316, defined by the first upper pin joint 505B and the first lower pin joint 505C, and a second plane 317, defined by the second lower pin joint 505D and the second upper pin joint 505A, intersect at a desirable remote axis, herein the theta axis θ shown in FIG. 1B. In other embodiments, one or a combination of the joints 505A-D features a flexural pivot bearing, such as a press in flexural pivot bearing.

The position of the connector member 513 is adjusted using two opposing fine pitched screws, a first adjustment screw 332 and a second adjustment screw 333, that are each disposed through threaded openings in the common member 510 and abut opposite sides of the connector member 513. When tightened, the first adjustment screw 332 pushes against a first side of the connector member 513 causing the connector member 513 to move in a clockwise direction. When the second adjustment screw 333 is tightened it pushes against a second side of the connector member 513 which causes the connector member 513 to move in a counter clockwise direction.

FIG. 6 is an enlarged view of a portion of the first body 50261. As shown, the frame member 522, the outside member 524, the inside member 523, and the common member 510 are operatively coupled by a plurality of revolute joints. In one example, the plurality of revolute joints is a plurality of second pin joints 605A-D. Each of the plurality of second pin joints 605A-D rotates to act as a pivot point disposed between, and coupling, two members of the first body 50261, to form a planer four-bar mechanism. The plurality of second pin joints 605A-D includes an upper outside pin joint 605B coupling the frame member 522 and the outside member 524, a lower outside pin joint 605C coupling the outside member 524 and the common member 510, a lower inside pin joint 605D coupling the common member 510 and the inside member 523, and an upper inside pin joint 605A coupling the inside member 523 and the frame member 522. Each of the plurality of second pin joints 605 are located so a third plane 416, defined by the upper outside pin joint 605B and the lower outside pin joint 605C, and a fourth plane 417 defined by the upper inside pin joint 605A and a lower inside pin joint 605D, intersect at a desirable remote axis. In one example, the remote axis is the phi axis ϕ. The location of the second pin joints 605 enables rotation of the pin engaging surface 152 of the lift pin hoop 142 about the phi axis ϕ by adjusting the position of the common member 510 relative to the position of the frame member 522. Typically, the position of the common member 510 is adjusted using the forward adjustment screw 237 and the rear adjustment screw 238. The movement of the common member 510 is confined to a gap 634 disposed between the frame member 522 and the common member 510. In other embodiments, one or a combination of the joints 605A-D features a flexural pivot bearing, such as a press in flexural pivot bearing.

Figure 7:
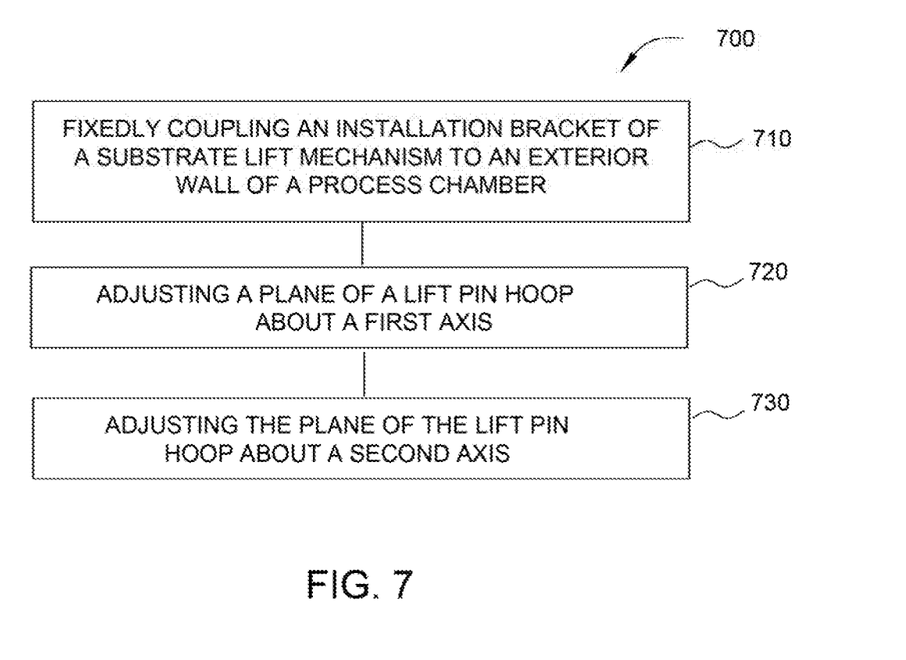
FIG. 7 is a flow diagram setting forth a method of adjusting a lift pin hoop, according to one embodiment.

FIG. 7 is a flow diagram setting forth a method 700 of adjusting a plane of the pin engaging surface of a lift pin hoop 142, according to an embodiment of the disclosure. At activity 710 the method includes fixedly coupling an installation bracket 102 of a substrate lift mechanism 101 to an exterior wall 146 of the base 156 of the chamber body 150 of a processing chamber 100. Herein, the installation bracket 102 is located outside of the processing chamber and is fixedly coupled to the exterior wall 146 of the processing chamber 100 using a plurality of fasteners, such as a plurality of bolts, disposed through one or more mounting surfaces 103 of one or more frame members 222. The processing chamber includes a substrate support 120 disposed on a substrate support shaft 124 that is movably disposed through the exterior wall 146. A lift pin hoop 142 of the substrate lift mechanism 101 is disposed about the substrate support shaft 124 in a processing volume 199 of the processing chamber 100. A substrate support 120 is disposed on the substrate support shaft 124 and a plurality of lift pins 143 is movably and vertically disposed through openings in the substrate support 120. A lift pin plane, defined by base ends of the plurality of lift pins 143, is parallel with a surface of the substrate support 120 when the plurality of lift pins 143 are in a lowered position.

At activity 720 the method 700 includes adjusting the plane of a lift pin hoop 142 of the substrate lift mechanism 101 about a first axis, such as a theta axis θ. First adjustment mechanism 102A enables rotation of the pin engaging surface 152 of the lift pin hoop 142 about the theta axis θ by moving the position of the connector member 213 relative to the position of the common member 210. First, a first plurality of fasteners 228 clamping a first lock plate 227 to a surface of the first adjustment mechanism 102A are loosened so that a plane of the pin engaging surface 152 of the lift pin hoop 142 may be adjusted about the theta axis θ using the first adjustment screw 232 and the second adjustment screw 233. To rotate the pin engaging surface 152 of the lift pin hoop 142 in a first rotational direction about the theta axis θ the second adjustment screw 233 is loosened by a desired number of turns and the first adjustment screw 232 is tightened by an equal number of turns which pushes the connector member 213 in a direction away from the first adjustment screw 232 and towards the second adjustment screw 233. To rotate the pin engaging surface 152 of the lift pin hoop 142 in a second rotational direction about the theta axis θ, the first adjustment screw 232 is loosened by a desired number of turns, and the second adjustment screw 233 is tightened by an equal number of turns. Such adjustment of the first adjustment screw 232 and the second adjustment screw 233 pushes the connector member 213 in a direction away from the second adjustment screw 233 and towards the first adjustment screw 232. Once a desired rotation of the pin engaging surface 152 of the lift pin hoop 142 about the theta axis θ is achieved, the first lock plate 227 is securely clamped to the surface of the first adjustment mechanism 102A by tightening the first plurality of fasteners. Tightening the first plurality of fasteners prevents further movement of the connector member 213 relative to the common member 210.

At activity 730 the method includes adjusting the plane of the pin engaging surface 152 of the lift pin hoop 142 about a second axis, such as the phi axis φ. The second adjustment mechanism 102B enables rotation of the pin engaging surface 152 of the lift pin hoop 142 about the phi axis φ by moving the position of the common member 210 relative to the position of one or more frame members 222. The one or more frame members 222 are fixedly coupled to the exterior wall 146 of the base 156 of the chamber body 150 of the processing chamber 100. Herein, the second adjustment mechanism 102B includes a first body 102B1 and a second body 102B2 disposed on opposing sides of the first adjustment mechanism 102A. In other embodiments, the second adjustment mechanism 102B comprises a single body disposed on one side of the first adjustment mechanism 102A. First, a second plurality of fasteners 231 clamping one or more second lock plates 230 to surfaces of the second adjustment mechanism 102B are loosened so that the common member 210 may be moved relative to the fixed positions of the one or more frame members 222. To rotate the pin engaging surface 152 of the lift pin hoop 142 in a first rotational direction about the phi axis φ one or more rear adjustment screws 238 are loosened a desirable number of turns and one or more forward adjustment screws 237 are tightened an equal number of turns which pushes the common member 210 in a first direction with respect to the one or more frame members 222. To rotate the pin engaging surface 152 of the lift pin hoop 142 in a second rotational direction about the phi axis φ one or more forward adjustment screws 237 are loosened a desirable number of turns and one or more rear adjustment screws 238 are tightened an equal number of turns which pushes the common member 210 in a second direction with respect to the one or more frame members 222. Once a desired rotation of the pin engaging surface 152 of the lift pin hoop 142 about the phi axis φ is achieved, the one or more second lock plates 230 are fixedly coupled to one or more surfaces of the second adjustment mechanism 102B by tightening the second plurality of fasteners 231. Tightening the second plurality of fasteners 231 prevents movement of the common member 210 relative to the one or more frame members 222.

The installation bracket and adjustment methods provided herein beneficially enable fine, permanent, calibration of a horizontal plane of a lift pin hoop two centers of rotation remote from the installation bracket to improve calibration precision and reduce manufacturing and assembly time of a processing chamber.

While the foregoing is directed to embodiments of the present disclosure, other and further embodiments of the disclosure may be devised without departing from the basic scope thereof, and the scope thereof is determined by the claims that follow.

The invention claimed is:

1. A mounting bracket, comprising:
 a first adjustment mechanism, comprising:
  a common member;
  one or more first side members;
  a connector member; and
  a plurality of first joints pivotably coupling the common member, the one or more first side members, and the connector member; and
 a second adjustment mechanism comprising:
  a first body, comprising:
   the common member;
   one or more second side members;
   a first frame member; and a plurality of second joints pivotably coupling the common member, the one or more second side members, and the first frame member; and
a second body, comprising:
the common member;
one or more third side members;
a second frame member; and
a plurality of third joints pivotably coupling the common member, the one or more third side members, and the second frame member
wherein the first adjustment mechanism defines a first remote axis of rotation, the second adjustment mechanism defines a second remote axis of rotation, and the first remote axis of rotation intersects the second remote axis of rotation.

2. The mounting bracket of claim 1, wherein the plurality of first joints are flexure joints.

3. The mounting bracket of claim 1, wherein the common member is a unitary body.

4. The mounting bracket of claim 3, wherein the first adjustment mechanism and the second adjustment mechanism form a unitary body.

5. The mounting bracket of claim 1, wherein the first remote axis of rotation is orthogonal to the second remote axis of rotation.

6. The mounting bracket of claim 1, wherein the first adjustment mechanism further comprises one or more first adjustment screws disposed through one or more first threaded openings in the common member, and wherein the second adjustment mechanism further comprises one or more second adjustment screws, and wherein at least one of the one or more second adjustment screws is disposed through a second threaded opening in the first frame member.

7. The mounting bracket of claim 1, further comprising a lift pin hoop coupled to a first end of a lift shaft and an actuator assembly coupled to a second end of the lift shaft, wherein the actuator assembly is coupled to the connector member of the first adjustment mechanism.

8. A processing chamber, comprising:
a chamber body defining a processing volume and having a base;
a substrate support shaft;
a substrate support disposed on the substrate support shaft inside the processing volume; and
a substrate lift mechanism, comprising:
an installation bracket fixedly coupled to an exterior wall of the base of the chamber body, comprising:
a first adjustment mechanism, comprising:
a common member;
one or more first side members;
a connector member; and
a plurality of first joints pivotably coupling the common member, the one or more first side members, and the connector member; and
a second adjustment mechanism comprising:
the common member;
one or more second side members;
a frame member; and
a plurality of second joints pivotably coupling the common member, the one or more second side members, and the frame member;
a lift pin hoop disposed about the substrate support shaft and coupled to a first end of a lift shaft; and
an actuator assembly coupled to the installation bracket and to a second end of the lift shaft.

9. The processing chamber of claim 8, wherein the plurality of first joints are flexure joints.

10. The processing chamber of claim 8, wherein the common member is a unitary body.

11. The processing chamber of claim 8, wherein the plurality of first joints define a first remote axis of rotation and the plurality of second joints define a second remote axis of rotation, and wherein the first remote axis of rotation is orthogonal to the second remote axis of rotation.

12. The processing chamber of claim 11, wherein the installation bracket is fixedly coupled to the exterior wall of the base of the chamber body at a mounting surface of the frame member.

13. The processing chamber of claim 11, further comprising a first lock plate coupled to the common member and the connector member and a second lock plate coupled to the frame member and the common member, wherein the first lock plate is orthogonal to the first remote axis of rotation and the second lock plate is orthogonal to the second remote axis of rotation.

14. The processing chamber of claim 13, wherein the first adjustment mechanism further comprises one or more first adjustment screws disposed through one or more threaded openings in the common member, and wherein the second adjustment mechanism further comprises one or more second adjustment screws where at least one of the one or more second adjustment screws is disposed through a threaded opening in the frame member.

15. A substrate lift system, comprising:
an installation bracket, comprising:
a first adjustment mechanism, comprising:
a common member;
one or more first side members;
a connector member; and
a plurality of first joints pivotably coupling the common member, the one or more first side members, and the connector member; and
a second adjustment mechanism comprising:
the common member;
one or more second side members;
a frame member; and
a plurality of second joints pivotably coupling the common member, the one or more second side members, and the frame member;
a lift pin hoop coupled to a first end of a lift shaft, wherein the lift pin hoop is configured to extend a plurality of lift pins outwardly from a surface of a substrate support; and
an actuator assembly coupled to the installation bracket and to a second end of the lift shaft.

16. The substrate lift system of claim 15, further comprising a first lock plate coupled to the common member and the connector member of the first adjustment mechanism and a second lock plate coupled to the frame member and the common member of the second adjustment mechanism, wherein the first lock plate is orthogonal to a first remote axis of rotation of the first adjustment mechanism and the second lock plate is orthogonal to a second remote axis of rotation of the second adjustment mechanism.

17. The substrate lift system of claim 16, wherein the first adjustment mechanism further comprises one or more first threaded adjustment screws disposed through one or more first threaded openings in the common member, and wherein the second adjustment mechanism further comprises one or more second adjustment screws where at least one of the one or more second adjustment screws is disposed through a second threaded opening in the frame member.

18. The substrate lift system claim 17, wherein the plurality of first joints are flexure joints.

19. The substrate lift system of claim 17, wherein the substrate support is disposed on a substrate support shaft, the lift pin hoop is disposed about the substrate support shaft, and the plurality of lift pins are movably and vertically disposed through the substrate support.

\* \* \* \* \*